US011268992B2

(12) United States Patent
Miao et al.

(10) Patent No.: US 11,268,992 B2
(45) Date of Patent: Mar. 8, 2022

(54) METHOD AND SYSTEM FOR ONLINE MULTI-LAYERED GRID ADMITTANCE ESTIMATION WITH LIMITED DATA MEASUREMENTS

(71) Applicant: Siemens Aktiengesellschaft, Munich (DE)

(72) Inventors: Xia Miao, Cambridge, MA (US); Daniel Kloeser, Eckernförde (DE); Xiaofan Wu, North Brunswick, NJ (US); Ulrich Muenz, Plainsboro, NJ (US)

(73) Assignee: Siemens Corporation, Iselin, NJ (US)

( * ) Notice: Subject to any disclaimer, the term of this patent is extended or adjusted under 35 U.S.C. 154(b) by 175 days.

(21) Appl. No.: 16/556,357

(22) Filed: Aug. 30, 2019

(65) Prior Publication Data

US 2020/0081040 A1 Mar. 12, 2020

Related U.S. Application Data

(60) Provisional application No. 62/730,142, filed on Sep. 12, 2018.

(51) Int. Cl.
*G01R 19/25* (2006.01)
*G05B 17/02* (2006.01)

(52) U.S. Cl.
CPC ......... *G01R 19/2513* (2013.01); *G05B 17/02* (2013.01)

(58) Field of Classification Search
CPC .. G01R 19/2513; G05B 17/02; H02J 2203/10
See application file for complete search history.

(56) References Cited

U.S. PATENT DOCUMENTS

| | | | |
|---|---|---|---|
| 7,710,729 B2 | 5/2010 | Li et al. | |
| 2011/0313957 A1* | 12/2011 | Ide | G01C 21/20 706/12 |

(Continued)

FOREIGN PATENT DOCUMENTS

| | | | |
|---|---|---|---|
| CN | 103678900 A | * | 3/2014 |
| CN | 106684863 A | * | 5/2017 |

(Continued)

OTHER PUBLICATIONS

Qin, "Solving long time-horizon dynamic optimal power flow of large-scale power grids with direct solution method", 2013, IET Generation, Transmission and Distribution, pp. 895-906 (Year: 2013).*

(Continued)

*Primary Examiner* — Tarun Sinha
*Assistant Examiner* — Yossef Korang-Beheshti (57) ABSTRACT

A method for estimating an admittance matrix for a transmission network comprises estimating in an upper layer time-series data for hidden nodes in the transmission network, computing in a lower layer an estimated admittance matrix for the transmission network and iteratively exchanging information between the upper layer and the second lower layer to produce a final admittance matrix for the transmission matrix. In some embodiments, the method may further comprise spatially dividing the transmission network into a plurality of subnets in the upper layer and estimating the time-series data for the hidden nodes for each subnet. Estimating the times series data for the hidden nodes for each subnet in parallel.

14 Claims, 8 Drawing Sheets

(56) References Cited

U.S. PATENT DOCUMENTS

| | | | | |
|---|---|---|---|---|
| 2012/0182038 | A1* | 7/2012 | Marzetta | G01R 31/086 324/764.01 |
| 2017/0244250 | A1* | 8/2017 | Sun | G06Q 50/06 |
| 2017/0336465 | A1* | 11/2017 | Pignati | G01R 31/086 |
| 2020/0042569 | A1* | 2/2020 | Kourounis | G06F 17/11 |

FOREIGN PATENT DOCUMENTS

| | | | |
|---|---|---|---|
| CN | 108173284 | A * | 6/2018 |
| CN | 108899909 | A * | 11/2018 |

OTHER PUBLICATIONS

Hines, Paul, "Distributed Model Predictive Control for Electric Grids", 2004, CMU (Year: 2004).*

Stuart, T. A., & Herczet, C. J.; "A sensitivity analysis of weighted least squares state estimation for power systems" IEEE Transactions on Power Apparatus and Systems, (5), 1696-1701; 1973.

Edwin Benito Mitacc Meza et al.; "Parameter estimation through a genetic algorithm"; In: Proc 15th Int Conf ISAP '09, Curitiba, Brazil, 2009.

Jun Zhu and Ali Abur "Improvements in Network Parameter Error Identification via Synchronized Phasors"; IEEE Transactions on Power Systems, vol. 25, No. 1, Feb. 2010.

Yang, Jing, Tongwen Chen, and Min Wu. "Online impedance matrix estimation of interconnected power systems." Electrical Power & Energy Conference (EPEC), 2009 IEEE. IEEE, 2009.

A.S. Debs. "Estimation of steady-state power system model parameters." IEEE Trans Power Systems, 1974, 5:1260-1268.

Cobreces, S., Bueno, E. J., Pizarro, D., Rodriguez, F. J., & Huerta, F. (2009). "Grid impedance monitoring system for distributed power generation electronic interfaces"; IEEE Transactions on Instrumentation and Measurement, vol. 58, No. 9, Sep. 2009.

Yuzhang Lin et al. "Highly Efficient Implementation for Parameter Error Identification Method Exploiting Sparsity"; IEEE Transactions on Power Systems, vol. 32, No. 1, Jan. 2017.

Jun Zhu and Ali Abur; "Identification of Network Parameter Errors"; IEEE Transactions on Power Systems, vol. 21, No. 2, May 2006.

Florian Döβer and Francesco Bullo "Kron Reduction of Graphs With Applications to Electrical Networks"; IEEE Transactions on Circuits and Systems—I: Regular Papers, vol. 60, No. 1, Jan. 2013 / Jan. 1, 2013.

Sekyung Han, Daisuke Kodaira, Soohee Han, Bokyu Kwon, Yasuo Hasegawa, and Hirohisa Aki "An Automated Impedance Estimation Method in Low-Voltage Distribution Network for Coordinated Voltage Regulation"; IEEE Transactions on Smart Grid, vol. 7, No. 2, Mar. 2016.

Murcia, Javier Gusatvo Herrera. "Self and Mutual Transmission Line Impedance Estimation by Means of the Non-Linear Least Squares Method." Simposio Internacional sobre la Calidad de la Energia Eléctrica-SICEL. vol. 7. 2013.

Zarco P and Gomez A. "Power system parameter estimation: A survey." IEEE Trans Power Systems, vol. 15, No. 1: 216-222; Feb. 2000.

Stacchini de Souza J C, Do Coutto Filho M B, Meza E B M. "Trealment of multiple network parameter errors through a genetic-based algorithm." Elect Power Syst Res, 2009, 11:1546-1552; journal homepage: www.el sevier. com/locate/epsr.

Arafeh, Samir A., and Roland Schinzinger. "Estimation algorithms for large-scale power systems." IEEE Transactions on Power Apparatus and Systems, vol. PAS-98, No. 6, Nov./Dec. 1979; 1968-1977.

Sejun Park et al. "Learning with End-Users in Distribution Grids: Topology and Parameter Estimation." arXiv preprint arXiv:1803. 04812 (2018).

Jiafan Yu et al. "PaToPa: A Data-Driven Parameter and Topology Joint Estimation Framework in Distribution Grids" IEEE Transactions on Power Systems, vol. 33, No. 4, Jul. 2018.

Use of local measurements to estimate voltage-stability margin; Vu, K.; Begovic, M.M.; Novosel, D.; Saha, M.M.;, "Use of local measurements to estimate voltage-stability margin," Power Industry Computer Applications., 1997. 20th International Conference on , vol. No., pp. 318-323, May 11-16, 1997 doi: 10.1109/PICA.1997. 599420 URL:http://ieeexplore.ieee.org/stamp/stamp.jsp?tp=&arnumber=599420&isnumber=13050.

Vu, Khoi, et al. "Use of local measurements to estimate voltage-stability margin." IEEE Transactions on Power Systems 14.3 (1999): 1029-1035.

Yuan, Ye, Omid Ardakanian, Steven Low, and Claire Tomlin. "On the inverse power flow problem." arXiv preprintarXiv:1610.06631 (2016).

* cited by examiner

4-Bus System

METHOD AND SYSTEM FOR ONLINE MULTI-LAYERED GRID ADMITTANCE ESTIMATION WITH LIMITED DATA MEASUREMENTS

CROSS-REFERENCE TO RELATED APPLICATIONS

This application claims priority to U.S. Provisional Patent Application No. 62/730,142 filed Sep. 12, 2018 entitled "Topology constrained transmission grid admittance matrix estimation with limited measurement data", which is incorporated by reference herein.

TECHNICAL FIELD

This application relates to power transmission grid management.

BACKGROUND

The rapidly increasing integration of intermittent resources and responsive loads calls for new planning and control technologies to ensure their optimal operation. However, such technologies heavily rely on the knowledge of powerline parameters and topology (grid admittance matrix), which may be inaccurate or infrequently calibrated in today's power systems. Thanks to the development of advanced measurement devices, one common approach to estimate line parameters is via linear regression, which requires abundant noiseless measurements. In reality, unavoidable noise and limited installation of measurement devices hinders the performance of linear regression type methods. An online multi-layered method for estimating the grid admittance matrix with limited number of measurement devices would be desirable.

SUMMARY

A method for estimating an admittance matrix for a transmission network comprises estimating in a first upper layer time-series data for hidden nodes in the transmission network, computing in a second lower layer an estimated admittance matrix for the transmission network and iteratively exchanging information between the first upper layer and the second lower layer to produce a final admittance matrix for the transmission matrix. In some embodiments, the method may further comprise spatially dividing the transmission network into a plurality of subnets in the first upper layer and estimating the time-series data for the hidden nodes for each subnet. Estimating time-series data for hidden nodes may further include solving a distributed optimal power flow problem for each of the subnets created by the spatial division of the transmission grid and modeling coupling between the subnet solutions as network constraints to create an estimation of unmeasured nodes across the transmission network. According to some embodiments, processing requirements may be reduced by estimating the times series data for the hidden nodes for each subnet in parallel.

According to some embodiments, the method further includes temporally dividing time-series data into time periods and estimating the admittance matrix estimation for neighboring time periods. Processing efficiency may be further increased by calculating the admittance matrix estimation for each of the neighboring time periods in the time-series data in parallel.

In the lower layer, estimating the admittance matrix for the transmission grid may include receiving time series measurements for buses in the transmission network, receiving time series data for the hidden nodes in the transmission network from the upper layer, applying power flow equations to the received time series measurements and the unmeasured nodes information, optimizing an impedance estimate for each bus in the transmission network for each time period in the time series measurements and approximating a long horizon optimal solution based on the optimized impedance estimates for each bus in the transmission network.

The performance of iterations of data exchange between the first upper layer and the second lower layer until convergence is reached or the iterations may be terminated after a predetermined number of iterations.

According to a system for estimating an admittance matrix for a transmission network includes a network admittance matrix estimator processor performing an estimate in a first upper layer time-series data for hidden nodes in the transmission network, compute in a second lower layer an estimated admittance matrix for the transmission network and iteratively exchange information between the first upper layer and the second lower layer to produce a final admittance matrix for the transmission matrix. The network admittance matrix estimator processor further configured to spatially dividing the transmission network into a plurality of subnets and estimate the time-series data for the hidden nodes for each subnet in the upper layer. Estimating the time-series data for hidden nodes may further include solving a distributed optimal power flow problem for each of the subnets created by the spatial division of the transmission grid and modeling coupling between the subnet solutions as network constraints to create an estimation of unmeasured nodes across the transmission network.

In some embodiments the network admittance matrix estimator processor may further estimate the times series data for the hidden nodes for each subnet in parallel.

According to other embodiments the estimation of an admittance matrix is performed by temporally divide time-series data into time periods and estimating the admittance matrix estimation for neighboring time periods. The the admittance matrix estimation for each of the neighboring time periods in the time-series data may be calculated in parallel.

Via the proposed multi-layered process with certain practical assumptions, estimating the grid admittance matrix with high accuracy is achievable. In addition, the low computational complexity of the proposed method enables its online implementation capability, especially for large-scale power systems or with huge amount of measurement data. Effectiveness and robustness of the algorithm is illustrated on a preliminary custom power system.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Obtaining accurate grid admittance matrix is of great importance for power systems analysis and operation. Admittance is a measure of the ability of a circuit to pass electric current. An admittance matrix contains admittance values for each branch of a given system or network, such as a transmission grid. Related applications typically rely on accurate information in the grid admittance matrix to calculate values for the analysis and control of operation of the grid. These applications rely on accurate admittance matrix information for performing calculations including algorithms for power system state estimation, power flow calculation, control and stability analysis, system monitoring, fault detection, and the like. Modern power systems are characterized by significant and dynamic changes (e.g., large integration of intermittent renewable generation, responsive and dynamic loads, etc.) that are observed more frequently than in previous systems. Accordingly, increasing the accuracy of high voltage transmission grid admittance parameters provide improvements in the efficiency and stability of system operation. With advanced measurement, communication, and control infrastructures rapidly improving and becoming more prevalent, the development of more accurate admittance model estimation algorithms may be utilized to drive the system closer to the stability boundaries, enable higher renewable integration; improve resiliency, reduce cost, enable smarter control actions, as well as other benefits.

In the past, engineers and researchers have come to realize that errors in the network grid admittance may greatly deteriorate the efficiency of system operation or in worst cases cause instability. For example, the influence of the grid admittance error on the state estimation solution has been studied. It should be noted that the accuracy of grid admittance becomes even more critical in today's power industry, where profound changes have occurred, such as large integration of intermittent resources, renewable generations, and responsive and dynamic loads. These newly installed components may change the grid parameters more frequently and significantly during system operation.

Conventionally, the grid admittance matrix is assumed to be constant and calculated off-line during commissioning, either theoretically using physics formulas or experimentally using two ends measurements of a single line. For the case when only limited measurements are available, the grid admittance estimation is commonly conducted on an equivalent network derived via the Kron reduction. Neither of these methods is capable of providing real-time accurate information in today's power systems.

Recently, thanks to the development of Phasor Measurement Units (PMUs), many single-line impedance/admittance estimation methods have been proposed. These methods focus on a single line and require PMU measurements installed at both ends of a line. However, they are not feasible for large-scale network implementation because PMUs are expensive, and it is cost prohibitive where too many measurement devices are required. Some approaches for network admittance estimation have used recursive least square approaches. But these approaches are designed based on Thevenin equivalent systems. This creates a disadvantage in that the network topology is no longer preserved.

Another related area of study receiving attention is parameter error identification/estimation. Existing methods may be classified into different groups based on their adopted techniques (e.g., residual sensitivity analysis, heuristic algorithms augmented state vector, and normalized Lagrange multipliers). It should be noted that these methods are not designed for scenarios where only limited measurements are available. In fact, any known method irrespective of the technique used requires a certain level of redundancy in measurements.

Although advanced infrastructures are becoming increasing common, the admittance matrix of a large-scale power grid is still challenging to obtain. This may be attributable to the fact that only a limited number of measurement devices are available. When these limitations are considered topology and parameter joint estimation methods have been proposed. Prior research has considered a balanced radial network with linearized power flow models, while other approaches assume PMU measurements of every node are available. However, this research targeted small distribution grids and the results achieved make assumptions that are not satisfied when considering a real large-scale transmission grid. In addition, the computational complexity of prior methods is high as complex optimizations are solved recursively. Thus, prior attempts at admittance estimation are not suitable for online implementation of large-scale power systems. Other prior solutions have formulated the admittance estimation problem as an inverse power flow problem. This method uses a traditional regression model and assumes that noiseless time-synchronized voltage and current phasor measurements at various locations are available. As a result, the method is not robust due to measurement errors, delay, noise, etc., which are unavoidable in practice.

According to aspects of the embodiments described in this disclosure, the challenge in grid admittance estimation of a complicated large-scale power system with limited measurements is considered. It is assumed that the network topology is known but Phasor Measurement Unit (PMU) measurements are only available at a limited number of buses. Methods according to these embodiments only require a small number of measurement devices at a few locations across the network with arbitrary topology. As will become apparent, this feature is especially useful for large-scale networks. The methods described herein only require simple algebraic computation and matrix operations. For this reason, the methods can easily be implemented online with simple computing units. The methods provide guaranteed performance achievable within each layer of the proposed optimization algorithm. This allows the solution to be robust with respect to measurement errors and noise. The described method is purely passive and does not require active injection of current signals into the grid. Therefore, it is always compliant with the grid code.

Figure 1:
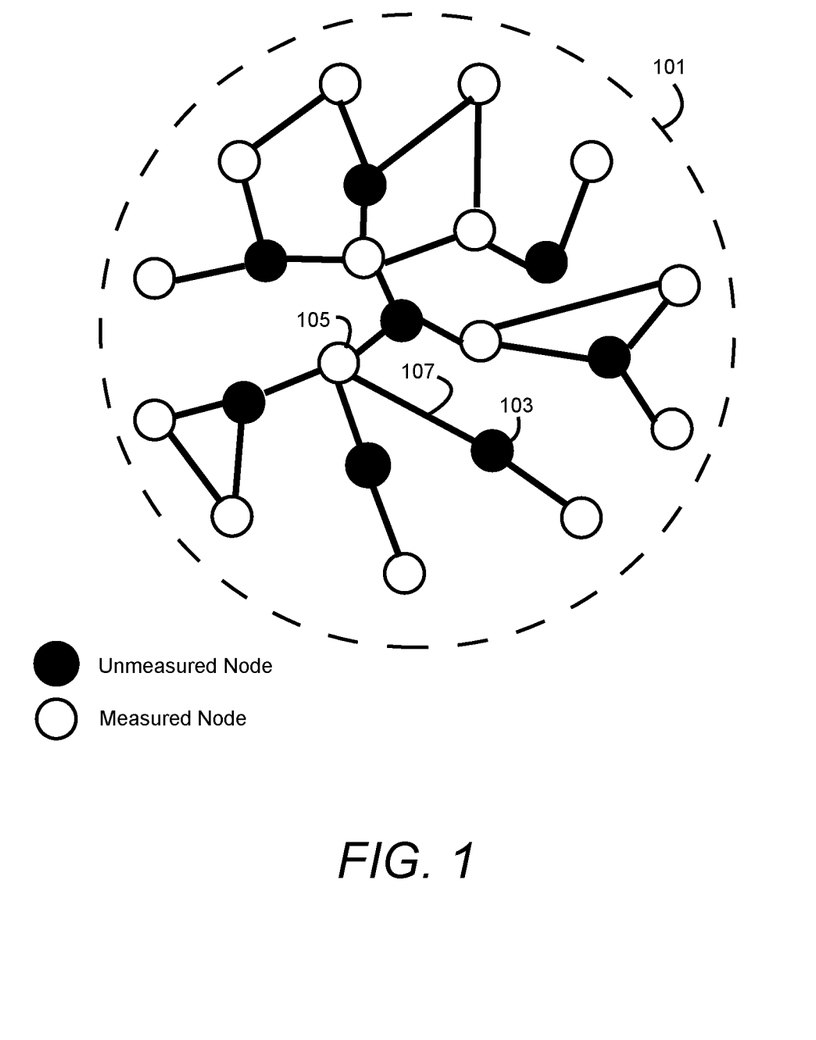
FIG. 1 is a diagram of a transmission grid including measured and unmeasured nodes according to aspects of embodiments of this disclosure.

FIG. 1 shows a transmission network 101 including measured nodes 105 and unmeasured nodes 103 connected by transmission lines 107.

The notations used to describe the power system and data throughout this disclosure are defined as follows:

Set:

Sets $\mathcal{H}$ is defined as $\mathcal{H} = \{1, \ldots, h\}$ and $\mathcal{H} : \mathcal{H}/h$ Component Level:

The impedance of line k is represented as $z_{ij} = R_{ij} + jX_{ij} \in \mathbb{C}$, where $R_{ij}$ is the resistance, $X_{ij}$ is the reactance, and j is the imaginary unit. Similarly, the admittance is denoted as $y_{ij} = 1/z_{ij} = g_{ij} + jb_{ij}$, where $g_{ij}$ and $b_{ij}$ are susceptance and capacitance, respectively.

System Level:

Given an arbitrary power system, its topology is denoted as a pair $(\mathcal{N}, \varepsilon)$, where $\mathcal{N}$ is the set of buses and $\varepsilon \subseteq \mathcal{N} \times \mathcal{N}$ is the set of lines connecting different buses. $|\mathcal{N}|$ and $|\varepsilon|$ denote the cardinality of $\mathcal{N}$ and $\varepsilon$, respectively. It should be noted that the direction of the elements in line set $\varepsilon$ is defined from the bus with small index to the one with large index. If a line $k=(i,j)\in\varepsilon$, we know that the direction is from Bus i to bus j with i<j. In addition, corresponding admittance matrix $Y \in C^{|\mathcal{N}| \times |\mathcal{N}|}$ is defined as $Y_{ik} = -y_{ikk}(i \neq k)$ and $Y_{ii} = \sum_{k=1, k \neq i}^{|\mathcal{N}|} y_{ik}$. Notice that $Y_{ik} = Y_{ki}$. The incident matrix $A \in \mathcal{R}^{|\mathcal{N}| \times |\varepsilon|}$ is defined line-wise as $A_{ik} = 1$ and $A_{jk} = -1$ of line k, with all other elements zero.

Collected Data:

Let $\mathcal{M} \subseteq \mathcal{N}$ denotes a set of buses with measurements installed, where $|\mathcal{M}| < |\mathcal{N}|$. $\mathcal{P}, \mathcal{Q}, V, \theta \in \mathbb{R}^{|\mathcal{M}| \times |\mathcal{N}|}$ represent the measured real power injection, reactive power injection, voltage magnitude and voltage angle of all buses, respectively. $|\mathcal{T}|$ denotes the number of time steps of measured data, as installed measurement devices provide time series data. At time t, $t^{th}$ column of real power nodal injection matrix $\mathcal{P}_t$ for instance, has the form $\mathcal{P}_t = [p_1[t], \ldots, p_{|\mathcal{M}|}[t]]^T$, where $p_i[t]$ denotes real power injection at bus/of time t when no confusion arises. It should be noted that matrix $\mathcal{Q}, V$, and $\theta$, have the same structure with elements $q, v$, and $\theta$ respectively.

Remark 1:

A power system network is radial if its pair $(\mathcal{N}, \varepsilon)$ does not have cycle, i.e., $\ker(A) = \emptyset$, where $\ker(A)$ is called the cycle space of the power system network. For $x \in \mathbb{R}^{|\mathcal{N}|}$, $A^T x \in \mathbb{R}^{|\varepsilon|}$ is a vector with elements $x_i - x_j$. Thus, if $x \in V$, $A^T x$ denotes a vector of voltage drop over each line.

Currently, measurement devices, such as PMU, E-meters, etc. installed in power systems are capable of providing data near real time. However, for state of the art least square-based estimation approaches, handling a huge amount of data in real time presents a big challenge. To this point there is no efficient solution. The goal is to find a method that can solve the estimation problem in real time given limited number of sensors.

Therefore, the network admittance matrix estimation problem considered in the following description may be formulated as:

Problem: data-driven admittance matrix estimation of a large-scale power system based on noisy measurements provided by a limited number of PMUs.

Given: a sequence of historical measurements ($\mathcal{P}, \mathcal{Q}, V$, and $\theta$) at limited number of buses; a known grid incident matrix A.

Find: the impedance of each line by estimating the admittance matrix Y.

System Model

Given a power system with its topology described by the pair $(\mathcal{N}, \varepsilon)$, its nodal real/reactive power injection, nodal voltage and grid admittance matrix Y can be linked through the well-known power flow equation.

For time step t, notice that the nodal voltage phasor $U_t$ has the form:

$$U_t = V_t \circ e^{j\theta_t} \in \mathbb{C}^N \qquad \text{Equation (1)}$$

where $e^{j\theta_t} = [e^{j\theta_t}, \ldots, e^{j\theta_{|\mathcal{N}|t}}]^T$; $\circ$ is a component-wise multiplication operator, called a Hardamard product.

The bus current injections $I_t \in \mathbb{C}^N$ in the system are obtained by formulating the Kirchoff's Current Law (KCL) at each bus:

$$I_t = YU_t \qquad \text{Equation (2)}$$

Therefore, the power flow equations of the system are:

$$P_t + jQ_t = U_t \circ \overline{I_t} = U_t \circ (\overline{U_t} \overline{Y}) \qquad \text{Equation (3)}$$

where $(\overline{*})$ denotes the conjugate of $(*)$.

Alternatively, power flow equations at bus i can be written as:

$$p_i = \sum_{k=1}^{|N|} v_i v_k (-g_{ik} \cos\theta_{ik} + b_{ik} \sin\theta_{ik}) \qquad \text{Equation (4)}$$

$$q_i = \sum_{k=1}^{|N|} v_i v_k (-g_{ik} \sin\theta_{ik} + b_{ik} \sin\theta_{ik})$$

Remark 2:

If measurement devices (PMUs) are installed at all buses, i.e. the system is fully detectable, the admittance matrix estimation problem can be formulated as a nonlinear regression problem using Equation (3). However, the aforementioned challenges arise when only limited number of measurements are considered.

Estimation Algorithm

Figure 2:
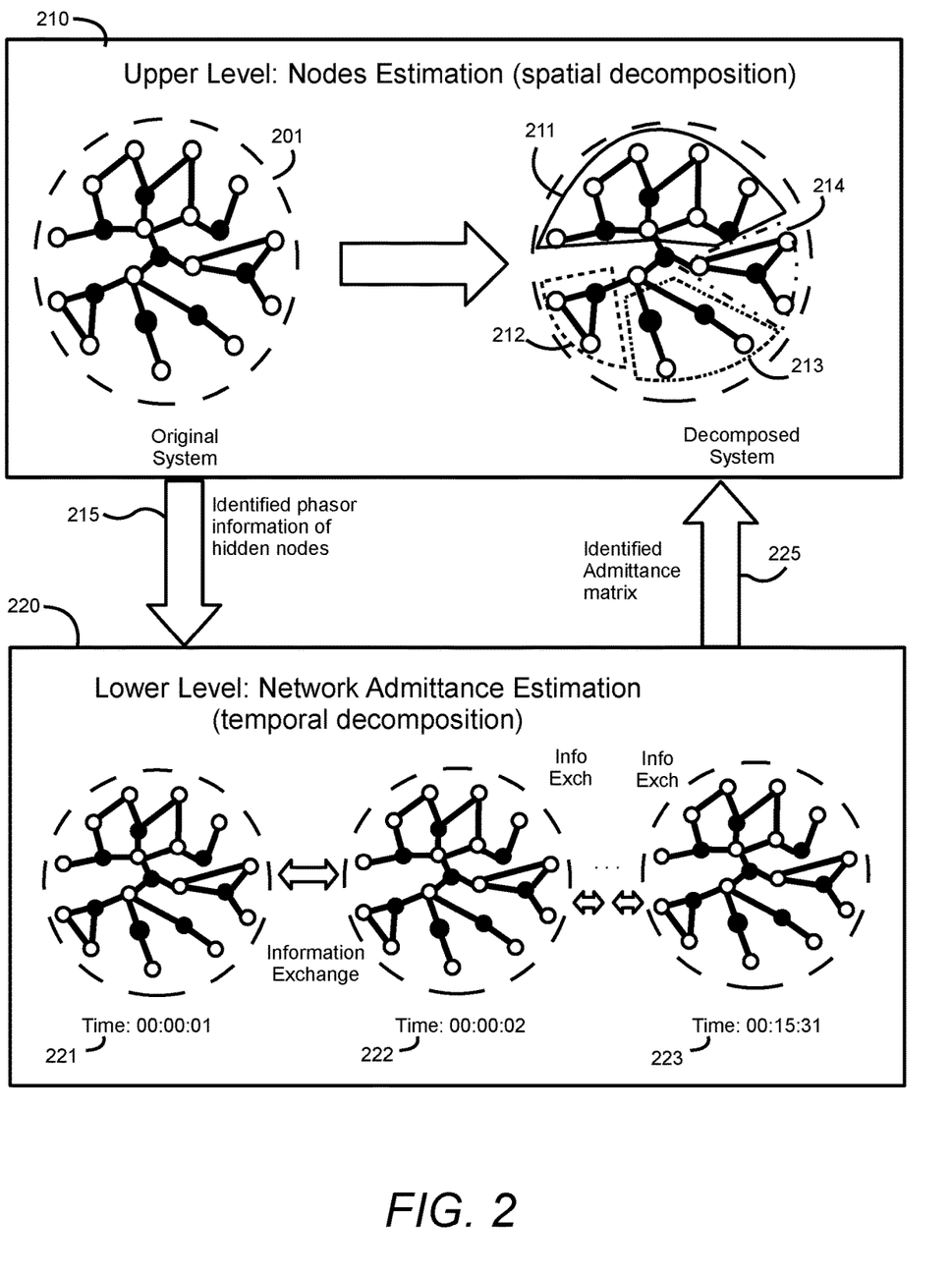
FIG. 2 is a functional diagram of a spatial/temporal method for estimating the admittance matrix for a transmission grid including unmeasured nodes.

In this section, a multi-layered estimation framework for solving the problem is presented. As shown in FIG. 2, the proposed estimation framework consists of an upper layer 210 and a lower layer 220 aiming at iteratively estimating hidden nodes information 215 and network admittance 225 respectively. By decomposing the problem into two layers, the complexity of the overall problem is reduced. The proposed estimation algorithm is listed below. As will be shown later within each layer, spatial and temporal properties of the system and collected measurement data are utilized to improve the efficiency.

Proposed Multi-Layered Estimation Method

Input: Measurement data ($P_m, Q_m, V_m, \theta_m$),

Initial Guess: Hidden Nodes: ($V_e^0, \theta_e^0$)

1: while i:=1→Max do

2: $Y^i$←Network admittance Estimation ($V_e^{i-1}, \theta_e^{i-1}$)

3: ($V_e^{i-1}, \theta_e^{i-1}$)←Hidden Nodes Estimation ($Y^i$)

Output: Estimated admittance $Y^{Max}$; Hidden nodes information($V_e^{Max}$, $\theta_e^{Max}$)

The upper layer 210 process estimates the hidden nodes information 215 utilizing the lower layer 220 estimation result. Then, the lower layer 220 process repeats the network admittance estimation 225 with the updated information 215 exchanged from the upper layer process 210. With iteratively updating both layers 210, 220, a joint estimation of both hidden nodes information and network admittance is gradually achieved in real time. The estimation procedure will now be described in greater detail.

It should be emphasized that the sensor placement assumption may be relaxed, that is, it is not required that PMUs are installed at every node with degree less than 3. The only assumption behind the proposed estimation framework is listed as follows.

Assumption 1: Nodal real and reactive power injection of hidden nodes (without measurement devices installed) are zero.

A. Lower Layer: network admittance estimation via temporal decomposition.

Figure 3:
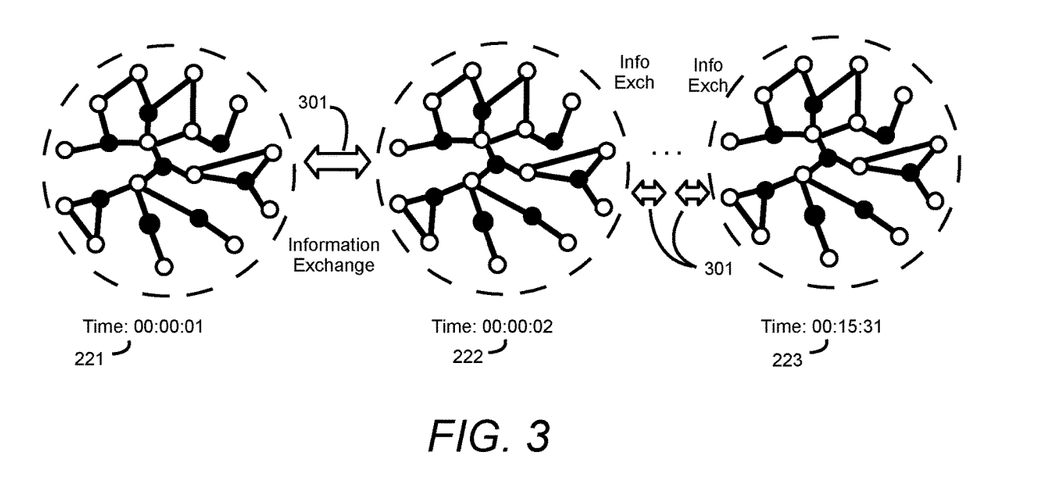
FIG. 3 is a diagram of temporal separation for estimating an admittance matrix for a transmission grid.

To illustrate the design of the lower layer process, we use a general system shown in FIG. 3, in which measured buses are unfilled circles. The pair ($\mathcal{N}$, $\varepsilon$) is used to represent the system topology. $\mathcal{M}$ is the set of measured buses and A is the incident matrix. The network is then considered at different points in time 221, 222, 223. To identify any changes in the properties of the system topology between time instants 221, 222, 223.

Let $x_m = [V_m, \theta_m, \mathcal{P}_m, \mathcal{Q}_m]^T$ denotes the time-series measurements of buses in $\mathcal{M}$. For the rest of the hidden buses (filled circles), corresponding information $x_e = [V_e, \theta_e]^T$ are provided by the upper layer hidden nodes estimation. Therefore, in the lower layer network admittance estimation process, time-series information of all buses is known.

In order to estimate the network admittance matrix based on $x_m$ and $x_e$, power flow equations Equation (3) can be rewritten in the following form:

$$p_i = \sum_{k=1}^{|\varepsilon|} -b_{ij}|A_{ik}|v_{ik}v_{jk}\sin(A_{ik}\theta_{ik} - A_{jk}\theta_{jk}) + \quad \text{Equation (5)}$$
$$g_{ij}|A_{ik}|(v_{ik}^2 - v_{ik}v_{jk}\cos(A_{ik}\theta_{ik} - A_{jk}\theta_{jk}))$$

$$q_i = \sum_{k=1}^{|\varepsilon|} -g_{ij}|A_{ik}|v_{ik}v_{jk}\sin(A_{ik}\theta_{ik} - A_{jk}\theta_{jk}) -$$
$$b_{ij}|A_{ik}|(v_{ik}^2 - v_{ik}v_{jk}\cos(A_{ik}\theta_{ik} - A_{jk}\theta_{jk}))$$

Notice that the network admittance can be uniquely constructed if line impedances are known. The network admittance estimation may then be formulated as a line impedance estimation problem. Defining a new measurement matrix W:

$$X = \begin{bmatrix} W & D \\ D & -W \end{bmatrix} W, D \in \mathbb{R}^{|N| \times |\varepsilon|}, \text{where} \quad \text{Equation (6)}$$
$$k = \{i, j\} \in \varepsilon$$

$$w_{ij} = |A_{ik}|(v_{ik}^2 - v_{ik}v_{jk}\cos(A_{ik}\theta_{ik} - A_{jk}\theta_{jk})) \quad \text{Equation (7)}$$
$$d_{ij} = -|A_{ik}|v_{ik}v_{jk}\sin(A_{ik}\theta_{ik} - A_{jk}\theta_{jk})$$

And further introducing a new vector $$S = X\begin{bmatrix} g \\ b \end{bmatrix}, \quad \text{Equation (8)}$$

where g and b are the vectors of line susceptances and capacitances. Thus, historical measurement data $x_e$ can be used to construct the new vectors ($X_1 \ldots X_T$) and ($S_1 \ldots S_T$). An over-determined system can thus be constructed by stacking X and S of all-time steps. The estimated line impedance g and b can be obtained by solving the augmented Equation (8).

Remark 2:

Directly solving Equation (8) may require huge computational effort when a large-scale network or a large dataset is considered. This is because the dimension of X is large. Also, it is well-known that this process is sensitive to measurement errors.

Formulation Via Temporal Decomposition:

In order to reduce the complexity and improve robustness, the line impedances are dualized between adjoining time periods. As a result, the estimation problem may be decomposed into identical small subproblems with the line impedances of each time step $z_t := [g_t, b_t]^T$ as the decision variables. Therefore, the line impedances of each time period can be optimized independently.

$$\underset{z_t}{\text{minimize}} \|S_t - X_t z_t\|_2 \quad \text{Equation (9)}$$
$$\text{subject to } z_t \geq 0 \ t = 2, \ldots, T$$
$$(\lambda_t) \ z_t = z_{t-1}$$

Notice that a temporal constraint is added in the above formulation. This is because it may be observed that the line impedance variation is small in the normal operation. $\lambda_t$ is the dual variable of the temporal constraint.

In order to efficiently solve the above problem, the horizon T is partitioned into n stages and it is assumed that each stage is of equal length h:=T/n. Variables are further grouped by defining new vectors: $z_k = [z_{k,1}, \ldots, z_{k,h}]^T$, $S_k = [S_{k,1}, \ldots, S_{k,h}]^T$, and $X_k = \text{diag}[X_{k,1}, \ldots, X_{k,h}]^T k \in n$. Thus, the block form of Equation (9) is obtained:

$$\underset{z_k}{\text{minimize}} \|S_k - X_k z_k\|_2 + \|\lambda_{k+1}^T(\overline{\Phi}_{k+1} z_{k+1} - \underline{\Phi}_k z_k)\|_2 \quad \text{Equation (10)}$$
$$\text{subject to } z_k \geq 0$$
$$(\lambda_k) \ \overline{\Phi}_k z_k = \underline{\Phi}_{k-1} z_{k-1}$$
$$(\gamma_k) \ \Phi_k z_k = 0$$

The coefficient matrices $\Phi_k$, $\overline{\Phi}_k$, and $\underline{\Phi}_k$ satisfy:

$$\Phi_k z_k = [(z_{k,1} - z_{k,2}), \ldots, (z_{k,h-1} - z_{k,h})]^T$$
$$\overline{\Phi}_k z_k = z_{k,1} \ \underline{\Phi}_k z_k = z_{k,h} \ \Phi_1 = \Phi_2 = \ldots = \Phi_n \quad \text{Equation (11)}$$

In the objective function Equation (10), the first term represents the power conservation at each bus, while the second term reflects the important global information of the line impedances variation in the future stages. In particular, we note that the second term can be interpreted as terminal costs $\lambda_k$ and $\gamma_k$ denotes the dual variables of the line impedances temporal constraints between and with time stages, respectively.

Convexity and Optimality Discussion:

Now the convexity and optimality of the proposed problem is briefly analyzed. The result regarding the convexity is stated in the following theorem.

Theorem 1:

The lower layer estimation problem Equation (10) is convex.

Regarding the optimality, it is known that the optimal solution of each short time period is achievable. It may also be noted that the second term in the objective functions are exact approximations of the cost-to-go at an optimal solution of the overall problem Equation (8). The long horizon optimal solution may be better approximated if the "cost-to-go" term is estimated via iteration.

Moreover, it has been shown that if "cost-to-go" terms are optimal to its corresponding problems, solving decomposed sub-problems deliver an optimal solution to the long horizon overall problem. In Theorem 1, we have shown that the lower layer estimation problem is convex. Thus, it is possible to find an optimal $\lambda_S$. By exchanging information between adjoining time periods, the optimal solution for the long horizon problem can be achieved.

ADMM-Based Algorithm:

The ADMM algorithm is used to solve the proposed block estimation problem in the upper layer (10). The concept of information updates between adjoining time periods 301 is shown in FIG. 3.

In addition, it may be observed that sparsity usually exists in power systems. Thus, in the proposed algorithm, sparsity relaxation is added to further improve the computational efficiency. More specifically, the matrix $(X_k^T X_k + \Phi_k^T \lambda_k \lambda_{k+1}^T \Phi_k)$ is factored once and the factors are then used in cheaper back-solves in subsequent x-updates. This algorithm is briefly summarized as follows:

Procedure 2 Network Admittance Estimation

Input:

Measurement data ($\mathcal{P}_m$, $\mathcal{Q}_m$, $V_m$, $\theta_m$); Hidden nodes ($V_e$, $\theta_e$) (from Hidden Node Estimation)

1. $(\mathcal{V}_m, \theta_m, \mathcal{V}_e, \theta_e) \rightarrow X_k, S_k$
2. while i := 1 → Max do
3.    for k := 1 → n do
4.      $(z_k^{i+1}, \lambda_k^{i+1}) \leftarrow Z - \text{UPDATE} (*, \lambda_{k+1}^i, z_{k+1}^i)$
5.      Exchange $\lambda_k^{i+1}, \lambda_{k+1}^{i+1}, z_k^{i+1}, z_{k+1}^{i+1}, z_{k-1}^{i+1}$ Output: Admittance matrix $Y := \frac{1}{n} \sum_{k=1}^{n} Y_k^{Max}$ 6. function Z-Update ($X_k, S_k, \lambda_{k+1}, z_{k-1}, z_{k+1}$)
7.    $z_k$ update: ADMM approach Remark 3:

The optimization problem of each stage can be solved in parallel, which may also greatly reduce the computation time.

Upper Layer 210: Hidden Node Estimation Via Spatial Decomposition

The objective of the upper layer process 210 is to estimate the time-sequential information of hidden buses (marked as filled circles). The process has two inputs: collected measurement data $x_m$ and network admittance matrix Y estimated by the lower layer process 220.

As the admittance matrix Y is known, the hidden nodes estimation problem is equivalent to a constrained power flow problem. The problem may be formulated as:

$$\underset{x_e \theta_e}{\text{minimize}} \sum_{t=1}^{T} \|I_t - YU_t\|_2$$

subject to $$x_e[t] \in [0.95, 1.05] \; t = 1, \ldots, T$$

$$\theta_e[t] \in \left[\frac{-\pi}{2}, \frac{\pi}{2}\right]$$

It may require a very large computation time to solve Equation (12) in a centralized way when the network of interest is large. In order to reduce the complexity, the network structure is explored. In the proposed hidden node estimation, the original large-scale system 201 is spatially decomposed into subnets 211, 212, 213, 214, as shown in FIG. 2. This allows the formulation of optimization problems for subnets and the coupling between adjoining subnets may be modeled as network constraints. The decomposition procedure is similar as that of the lower layer process 220. By iteratively updating information between adjoining subnets 211, 212, 213, 214, the optimal solution for the entire system 201 may be found. It should be noted that the hidden nodes estimation via spatial decomposition is a particular case of the distributed optimal power flow problem. As a result, the methods of distributed power flow can be used to solve the hidden nodes estimation.

It should be noted that the proposed hidden nodes estimation may not provide a unique result due to the nonlinearity. However, the output ($x_e$, $\theta_e$) is a feasible power flow solution to the given system. In other words, a feasible estimation of hidden nodes is achievable.

Remark 4;

Estimation in both layers 210, 220 may provide guaranteed performance. In addition, subproblems in both layers 210, 220 can be conducted in parallel to reduce the computation time and enable on-line implementation.

Preliminary System Test

Figure 4:
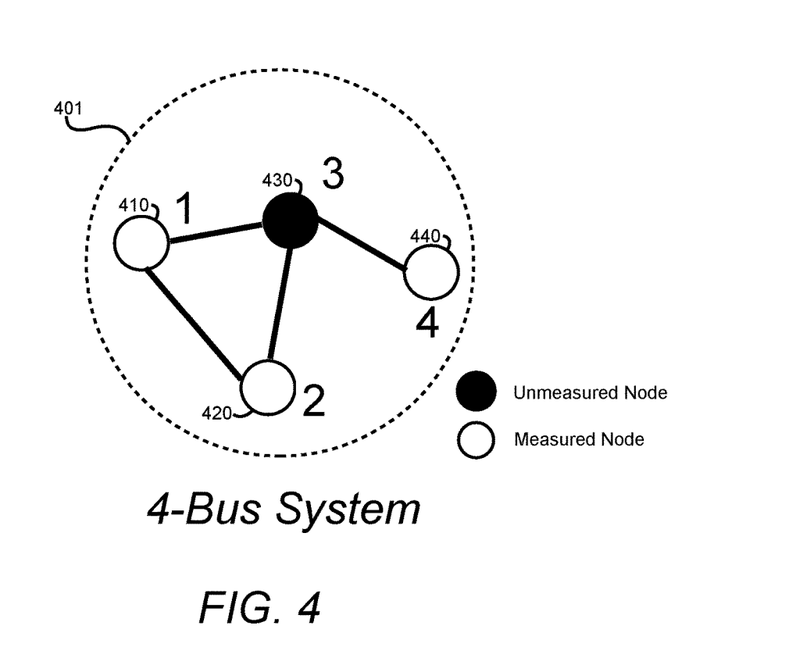
FIG. 4 is a diagram for an exemplary 4 bus transmission grid according to embodiments of this disclosure.

In this section, experimental results of the disclosed proposed admittance estimation method are presented with respect on a custom 4-bus example 401 as depicted in FIG. 4. The depicted 4-bus example 401 comprises four nodes, including measured nodes 410, 420 440 and unmeasured node 430. Measurement data are randomly generated under two different operational scenarios. In addition, different noise levels are added to the measurements to test the robustness.

A. System Description and Test Setup

1) System description: In order to test the proposed method in a general setup, a custom 4-bus example with mesh (loop) structure is created, as shown in FIG. 4. It is well-known that such structure is hard to solve as the corresponding incident matrix is singular. Furthermore, in this test system, measurement devices are installed only at node 1, 2 and 4. Node 3 is a hidden node which satisfies Assumption 1 above.

2) Test data preparation: Measurements data for each bus is randomly generated, satisfying the following conditions:

$$V_i[t] \in [0.95, 1.05] \; \theta_i[t] \in \left[-\frac{\pi}{2}, \frac{\pi}{2}\right]$$

Corresponding real and reactive power injections ($p_i[t]$ and $qq_i[t]$) can therefore be calculated based on the generated voltage profile. Furthermore, 5% Gaussian noise is added to the measurement data.

Under these settings, experiments are run by changing the size of data points from 10 to 3000. Then, the estimation accuracy and computational time is recorded for each experiment. In order to benchmark the proposed method, performance and computation time of the inverse power flow method is considered.

Remark 5:

Experiments are conducted using a personal laptop equipped with a 2.5 GHz Intel Core i7 CPU and 16 GB 1600 MHz DDR3 memory.

Test Results

Figure 5:
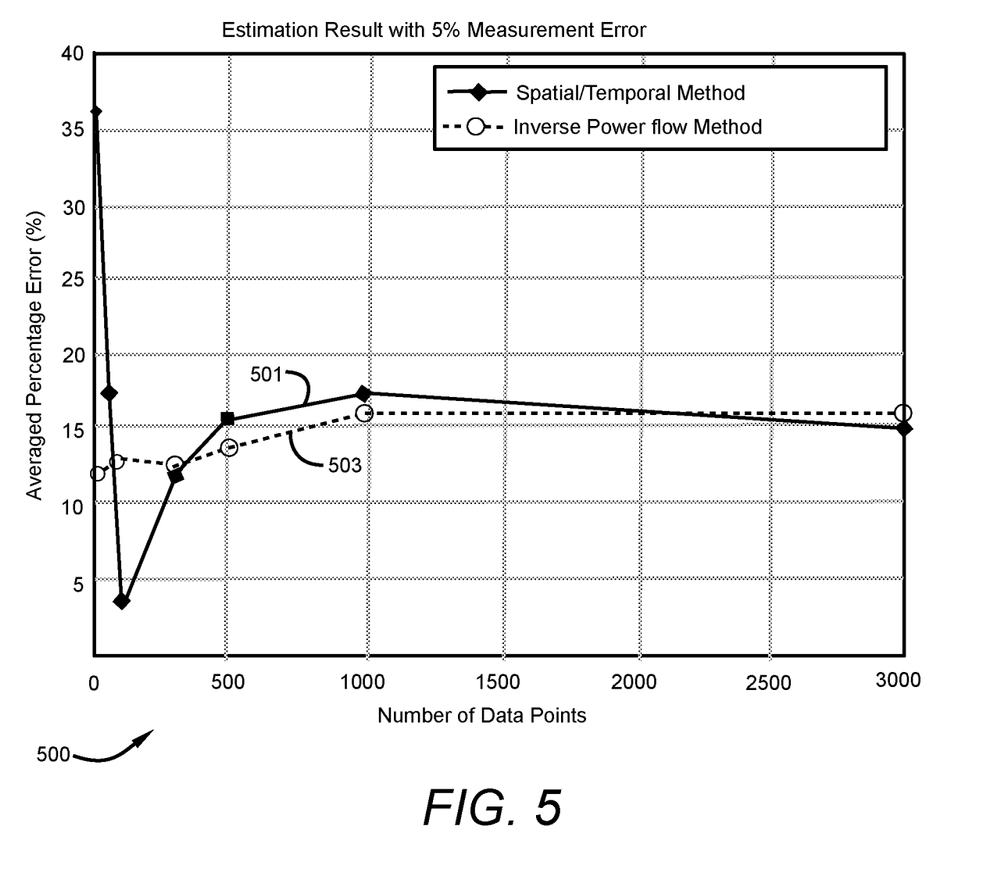
FIG. 5 is a graph showing an average error based on number of data points for a spatial/temporal method versus an inverse power flow method according to embodiments of this disclosure.
Figure 6:
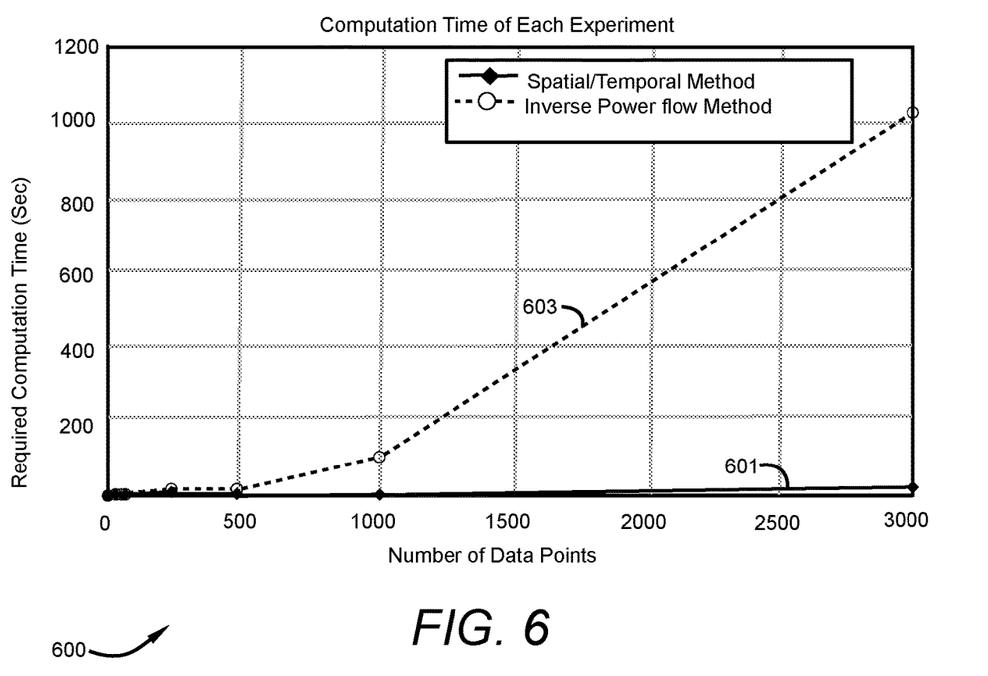
FIG. 6 is a graph showing computation time for a given number of points for a spatial/temporal method versus an inverse power flow method according to embodiments of this disclosure.

The estimation result of each experiment and corresponding computation time are listed in FIG. 5 and FIG. 6, respectively. FIG. 5 is a chart comparing the performance of a spatial/temporal method according to embodiments of this disclosure with a conventional inverse power flow method 500. The spatial temporal method 501 and the inverse power flow method 503 result in comparable percentage error at high numbers of data points. However, as seen in FIG. 6, which provides a chart comparing computation time 600 of the spatial/temporal method to the inverse power flow method, there is a drastic change in performance when computation time is considered. The computation time for the spatial/temporal method 601 remains small regardless of the number of data points considered. This is in stark contrast to the inverse power flow method 603 which increases rapidly in proportion to the number of data points.

It can be seen that the proposed spatial/temporal method performs well when noise is considered, compared with conventional techniques. However, the computational time of the proposed method is remarkably less than the existing solutions when large number of data points are used.

CONCLUSION

In this application a novel method for estimating the admittance matrix for a transmission grid which is able to estimate the admittance matrix by only using the measurements at limited locations was presented. In this approach a two-layered structure to jointly estimate the hidden mode information and the admittance matrix is introduced. In addition, temporal and spatial decomposition in each layer is conducted resulting in a great reduction in complexity. Furthermore, preliminary tests conducted on a 4-bus system, shows that the proposed method performs well when noise is considered. In addition, the computational time of our proposed method is substantially less than conventional techniques when large number of data points are considered for estimation.

Figure 7:
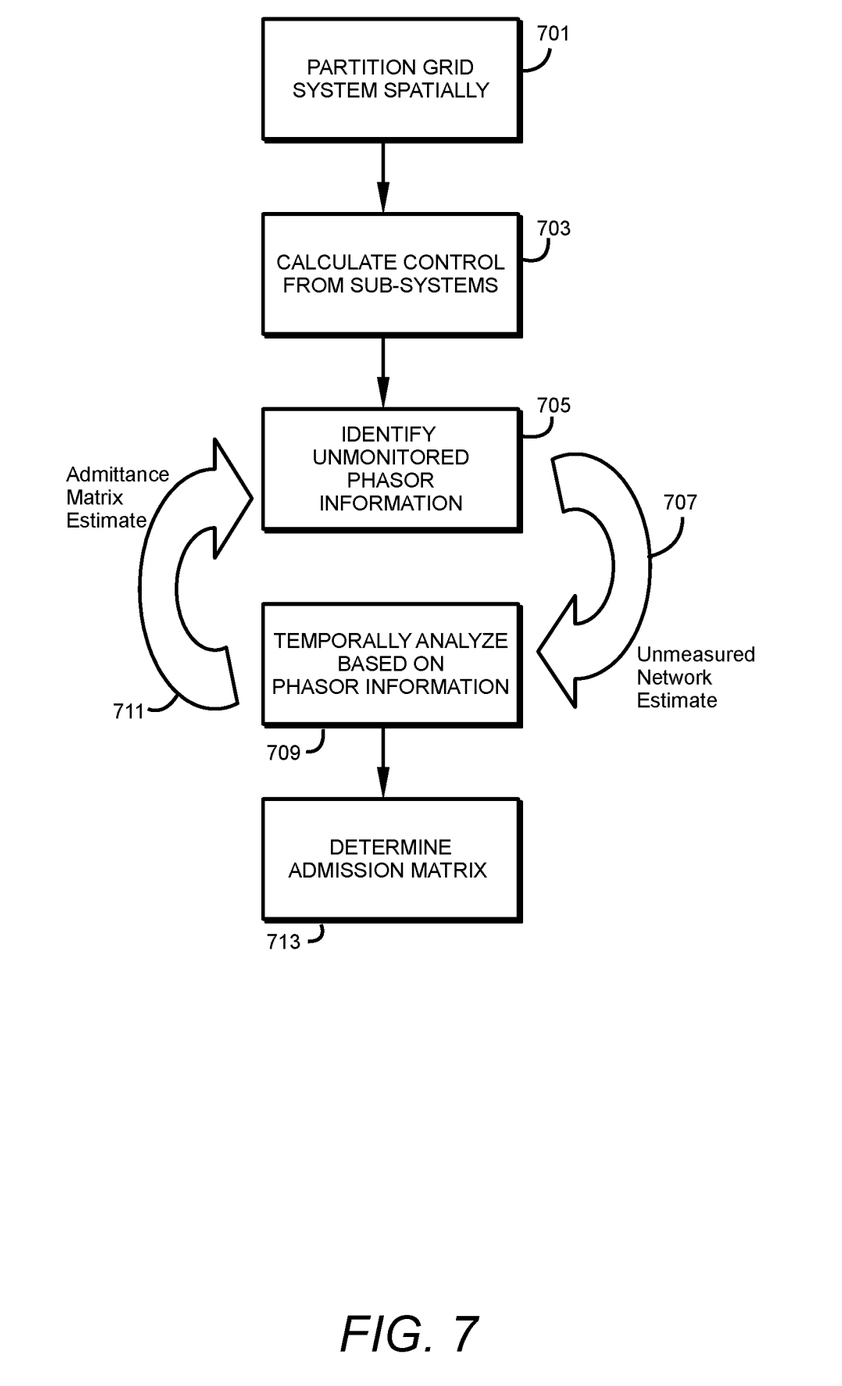
FIG. 7 is a process flow diagram for a spatial/temporal method for estimating a transmission grid admittance matrix according to embodiments of this disclosure.

FIG. 7 is a process flow diagram illustrating a spatial/temporal method for estimating an admittance matrix according to embodiments of this disclosure. A transmission grid is partitioned spatially to create subnetworks that are solved simultaneously to estimate the network containing some unmeasured nodes 701. From the subnetworks, a control model is calculated 703. The unmonitored phasor information is then identified for the entire network 705. The estimate identified for the unmonitored phasor information is presented as in input for analysis of the estimated system 707. The estimated system is analyzed on a temporal basis where time series instances are compared to produce an admittance matrix estimate for the system 709. The estimated admittance matrix is provided back 711 as input to update the estimate for the unmonitored phasor information 705 based on the spatially partitioned grid. The spatial partitioning 701 and associated analysis 703, 705 may be considered a first or upper layer, while the temporal analysis 709 of the identified unmonitored network estimate 707 may be considered a second or lower layer. Information exchange between the upper layer and the lower layer and conversely from the lower layer to the upper layer (steps 707 and 711, respectively) is repeated iteratively until convergence on the estimated admittance matrix is determined 713, or if convergence is not achieved, the iterative process may be terminated by other means, such as a time limit, or number of iterations. The final estimated admittance matrix is output 713 to provide the admittance matrix for the network while saving computational resources compared to prior methodologies.

Figure 8:
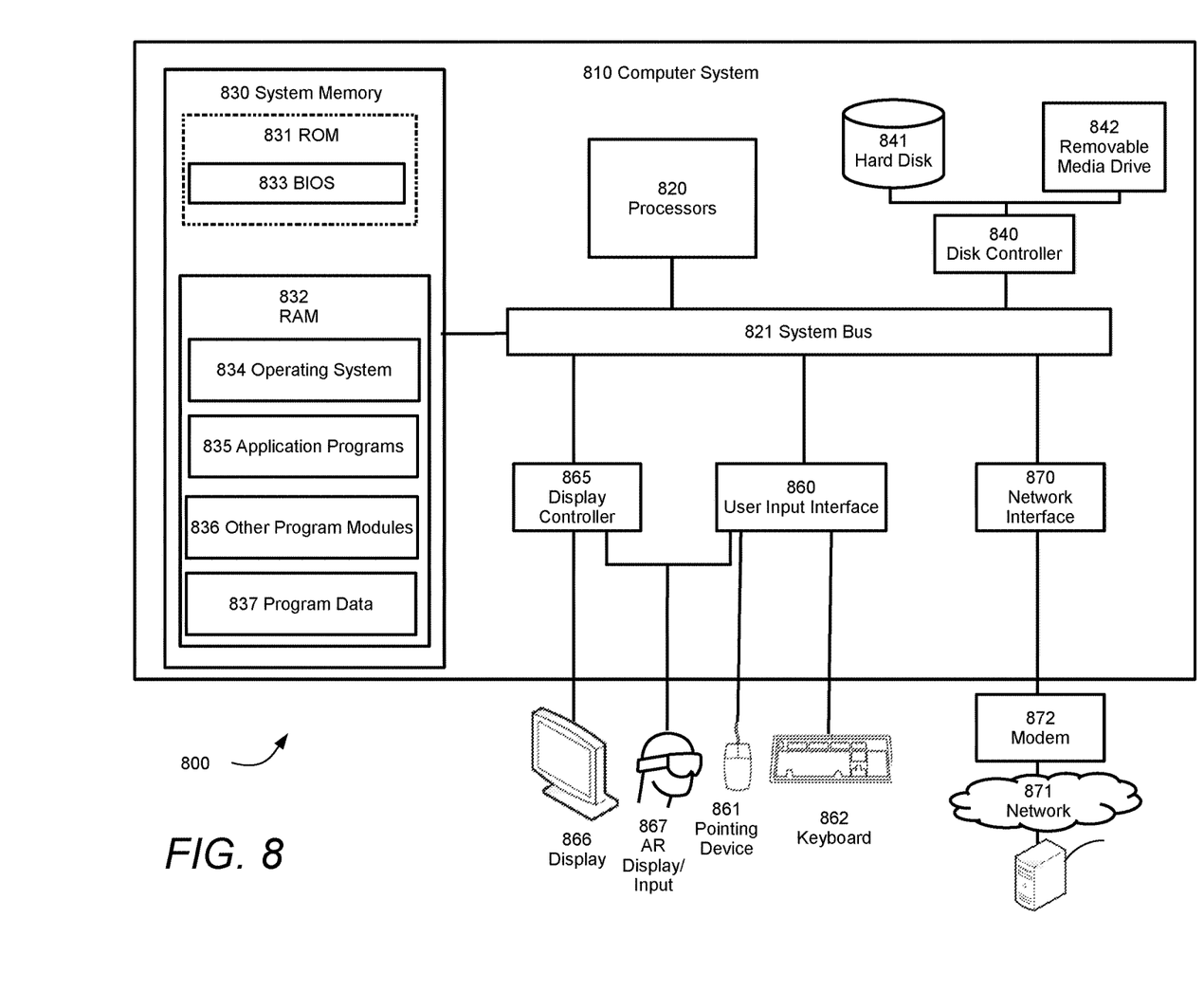
FIG. 8 is a computer system that may be used for implementing aspects of a spatial/temporal method for estimating an admittance matrix for a transmission grid according to embodiments of the present disclosure.

FIG. 8 illustrates an exemplary computing environment 800 within which embodiments of the invention may be implemented. Computers and computing environments, such as computer system 810 and computing environment 800, are known to those of skill in the art and thus are described briefly here.

As shown in FIG. 8, the computer system 810 may include a communication mechanism such as a system bus 821 or other communication mechanism for communicating information within the computer system 810. The computer system 810 further includes one or more processors 820 coupled with the system bus 821 for processing the information.

The processors 820 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general-purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 8, the computer system 810 also includes a system memory 830 coupled to the system bus 821 for storing information and instructions to be executed by processors 820. The system memory 830 may include computer readable storage media in the form of volatile and/or nonvolatile memory, such as read only memory (ROM) 831 and/or random-access memory (RAM) 832. The RAM 832 may include other dynamic storage device(s) (e.g., dynamic RAM, static RAM, and synchronous DRAM). The ROM 831 may include other static storage device(s) (e.g., programmable ROM, erasable PROM, and electrically erasable PROM). In addition, the system memory 830 may be used for storing temporary variables or other intermediate information during the execution of instructions by the processors 820. A basic input/output system 833 (BIOS) containing the basic routines that help to transfer information between elements within computer system 810, such as during start-up, may be stored in the ROM 831. RAM 832 may contain data and/or program modules that are immediately accessible to and/or presently being operated on by the processors 820. System memory 830 may additionally include, for example, operating system 834, application programs 835, other program modules 836 and program data 837.

The computer system 810 also includes a disk controller 840 coupled to the system bus 821 to control one or more storage devices for storing information and instructions, such as a magnetic hard disk 841 and a removable media drive 842 (e.g., floppy disk drive, compact disc drive, tape drive, and/or solid state drive). Storage devices may be added to the computer system 810 using an appropriate device interface (e.g., a small computer system interface (SCSI), integrated device electronics (IDE), Universal Serial Bus (USB), or FireWire).

The computer system 810 may also include a display controller 865 coupled to the system bus 821 to control a display or monitor 866, such as a cathode ray tube (CRT) or liquid crystal display (LCD), for displaying information to a computer user. The computer system includes an input interface 860 and one or more input devices, such as a keyboard 862 and a pointing device 861, for interacting with a computer user and providing information to the processors 820. The pointing device 861, for example, may be a mouse, a light pen, a trackball, or a pointing stick for communicating direction information and command selections to the processors 820 and for controlling cursor movement on the display 866. The display 866 may provide a touch screen interface which allows input to supplement or replace the communication of direction information and command selections by the pointing device 861. In some embodiments, an augmented reality device 867 that is wearable by a user, may provide input/output functionality allowing a user to interact with both a physical and virtual world. The augmented reality device 867 is in communication with the display controller 865 and the user input interface 860 allowing a user to interact with virtual items generated in the augmented reality device 867 by the display controller 865. The user may also provide gestures that are detected by the augmented reality device 867 and transmitted to the user input interface 860 as input signals.

The computer system 810 may perform a portion or all of the processing steps of embodiments of the invention in response to the processors 820 executing one or more sequences of one or more instructions contained in a memory, such as the system memory 830. Such instructions may be read into the system memory 830 from another computer readable medium, such as a magnetic hard disk 841 or a removable media drive 842. The magnetic hard disk 841 may contain one or more datastores and data files used by embodiments of the present invention. Datastore contents and data files may be encrypted to improve security. The processors 820 may also be employed in a multi-processing arrangement to execute the one or more sequences of instructions contained in system memory 830. In alternative embodiments, hard-wired circuitry may be used in place of or in combination with software instructions. Thus, embodiments are not limited to any specific combination of hardware circuitry and software.

As stated above, the computer system 810 may include at least one computer readable medium or memory for holding instructions programmed according to embodiments of the invention and for containing data structures, tables, records, or other data described herein. The term "computer readable medium" as used herein refers to any medium that participates in providing instructions to the processors 820 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 841 or removable media drive 842. Non-limiting examples of volatile media include dynamic memory, such as system memory 830. Non-limiting examples of transmission media include coaxial cables, copper wire, and fiber optics, including the wires that make up the system bus 821. Transmission media may also take the form of acoustic or light waves, such as those generated during radio wave and infrared data communications.

The computing environment 800 may further include the computer system 810 operating in a networked environment using logical connections to one or more remote computers, such as remote computing device 880. Remote computing device 880 may be a personal computer (laptop or desktop), a mobile device, a server, a router, a network PC, a peer device or other common network node, and typically includes many or all of the elements described above relative to computer system 810. When used in a networking environment, computer system 810 may include modem 872 for establishing communications over a network 871, such as the Internet. Modem 872 may be connected to system bus 821 via user network interface 870, or via another appropriate mechanism.

Network 871 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 810 and other computers (e.g., remote computing device 880). The network 871 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 871.

Figure 9:
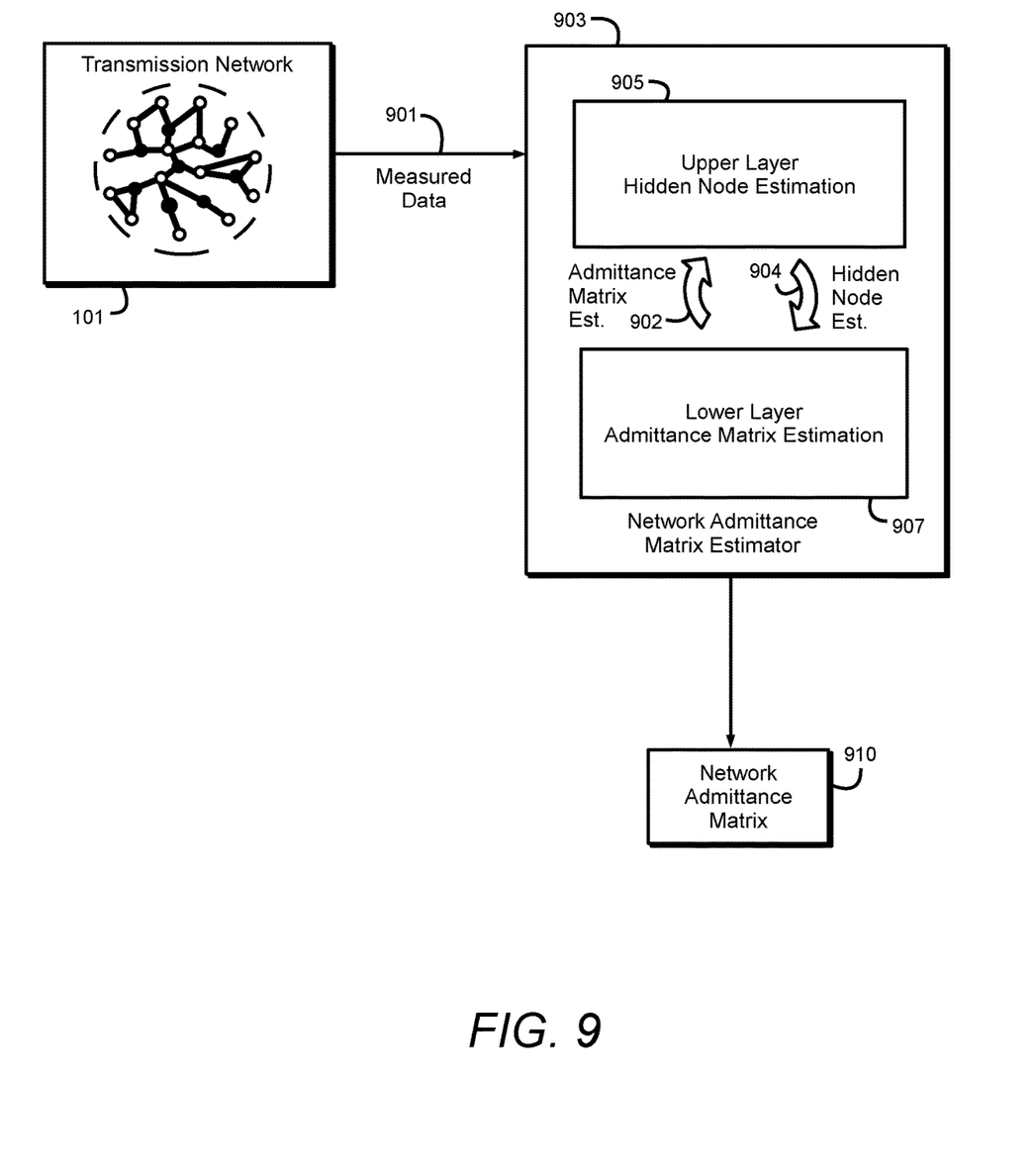
FIG. 9 is a block diagram of a system for estimating an admittance matrix for a transmission network according to aspects of embodiments described in this disclosure.

FIG. 9 is a block diagram of a system for estimating an admittance matrix for a transmission network according to aspects of embodiments of this disclosure. The transmission network 101 includes nodes and edges. Some, but one all, of the nodes are measured. Other nodes are not measured and may be referred to as hidden nodes. The measured nodes are monitored by a measurement device to produce measured data 901.

The measured data may be provided to a network admittance matrix estimator 903. The network admittance matrix estimator 903 may be implemented in a computer processor that is specialized for producing an estimate of the admittance matrix 910 for the transmission network 101. The network admittance matrix estimator 903 includes an upper layer 905 that is configured to estimate the hidden nodes in the transmission network 101 based on the measurement data 901 and a previously known network topology. The network admittance matrix estimator 903 further includes a lower layer 907 that is configured to receive the hidden node estimation 904 from the upper layer 905. The lower layer generates an admittance matrix estimate 902 from a time series of measured data 901 and the estimate of the hidden nodes 904 provided by the upper layer 905.

The upper layer 903 and lower layer 907 exchange information with one another iteratively until a final estimate of the admittance matrix 910 is achieved. In an iterative manner, the upper layer 905 generates an estimate of the time series data for the hidden nodes, that is nodes in the transmission network 101 that do not have a measurement device associated with them. The estimate of the hidden nodes information is provided to the lower layer 907 along with the time series measurement data 901 that is received from the measurement devices installed across the transmission network 101.

The upper layer 905 refines the hidden node estimate 904 while the lower layer 907 refines the estimated admittance matrix 902. When the iterative process of information exchange converges to a final solution, the final solution for the network admittance network 910 is output by the network admittance matrix estimator 903.

An executable application, as used herein, comprises code or machine-readable instructions for conditioning the processor to implement predetermined functions, such as those of an operating system, a context data acquisition system or other information processing system, for example, in response to user command or input. An executable procedure is a segment of code or machine-readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof.

The invention claimed is:

1. A method for estimating an admittance matrix for a transmission network, the transmission network comprising a plurality of nodes, the plurality of nodes comprising a set of measured nodes wherein measurement devices are installed and a set of unmeasured nodes wherein no measurement devices are installed, the method comprising:
   in a first layer, based on a known network topology, spatially dividing the transmission network into a plurality of subnets, and estimating time series data for unmeasured nodes of each subnet based on (i) measurement data obtained from measured nodes of that subnet via respective measurement devices and (ii) an estimated admittance matrix of the transmission network computed in a second layer, to compute an estimated time series data for the set of unmeasured nodes of the transmission network;
   in the second layer, obtaining time series data comprising (i) time series measurement data obtained from the set of measured nodes via respective measurement devices and (ii) the estimated time series data for the set of unmeasured nodes computed in the first layer, and computing the estimated admittance matrix of the transmission network by temporally dividing the time series data into time periods and estimating an admittance matrix for neighboring periods; and
   iteratively updating the first layer with the estimated admittance matrix of the transmission network computed in the second layer and updating the second layer with the estimated time series data for the set of unmeasured nodes computed in the first layer, to jointly compute the estimated admittance matrix of the transmission network and the estimated time series data for the set of unmeasured nodes.

2. The method of claim 1, wherein computing the estimated time-series data for unmeasured nodes in the first layer further comprises:
   solving a distributed optimal power flow problem for each of the subnets created by the spatial division of the transmission network;
   modeling coupling between the subnet solutions as network constraints to create an estimation of unmeasured nodes across the transmission network.

3. The method of claim 1, further comprising:
   computing the estimated time series data for the unmeasured nodes for each subnet in parallel.

4. The method of claim 1, further comprising:
   estimating the admittance matrix estimation for each of the neighboring time periods in the time-series data in parallel.

5. The method of claim 1, wherein computing the estimated admittance matrix for the transmission network in the second layer comprises:
   receiving time series measurements for buses in the transmission network;
   receiving time series data for the unmeasured nodes in the transmission network from the first layer;
   applying power flow equations to the received time series measurements and the unmeasured nodes information;
   optimizing an impedance estimate for each bus in the transmission network for each time period in the time series measurements; and approximating a long horizon optimal solution based on the optimized impedance estimates for each bus in the transmission network.

6. The method of claim 1, further comprising:
performing iterations of data exchange between the first layer and the second layer until convergence is reached.

7. The method of claim 1 further comprising:
performing iterations of data exchange between the first layer and the second layer for a predetermined number of iterations.

8. A system comprising:
a transmission network comprising a plurality of nodes, the plurality of nodes comprising a set of measured nodes wherein measurement devices are installed and a set of unmeasured nodes wherein no measurement devices are installed; and
a network admittance matrix estimator processor configured to:
in a first layer, based on a known network topology, spatially divide the transmission network into a plurality of subnets, and estimate time series data for unmeasured nodes of each subnet based on (i) measurement data obtained from measured nodes of that subnet via respective measurement devices and (ii) an estimated admittance matrix of the transmission network computed in a second layer, to compute an estimated time series data for the set of unmeasured nodes of the transmission network;
in the second layer, obtain time series data comprising (i) time series measurement data obtained from the set of measured nodes via respective measurement devices and (ii) the estimated time series data for the set of unmeasured nodes computed in the first layer, and compute the estimated admittance matrix of the transmission network by temporally dividing the time series data into time periods and estimating an admittance matrix for neighboring periods; and
iteratively update the first layer with the estimated admittance matrix of the transmission network computed in the second layer and update the second layer with the estimated time series data for the set of unmeasured nodes computed in the first layer, to jointly compute the estimated admittance matrix of the transmission network and the estimated time series data for the set of unmeasured nodes.

9. The system of claim 8, wherein, to compute the estimated time-series data for unmeasured nodes in the first layer, the network admittance matrix estimator processor is configured to:
solve a distributed optimal power flow problem for each of the subnets created by the spatial division of the transmission network;
model coupling between the subnet solutions as network constraints to create an estimation of unmeasured nodes across the transmission network.

10. The system of claim 8, wherein the network admittance matrix estimator processor is further configured to:
compute the estimated times series data for the unmeasured nodes for each subnet in parallel.

11. The system of claim 8, wherein the network admittance matrix estimator processor is further configured to:
estimate the admittance matrix estimation for each of the neighboring time periods in the time-series data in parallel.

12. The system of claim 8, wherein, to compute the estimated admittance matrix for the transmission network in the second layer, the network admittance matrix estimator processor is configured to:
receive time series measurements for buses in the transmission network;
receive time series data for the unmeasured nodes in the transmission network from the first layer;
apply power flow equations to the received time series measurements and the unmeasured nodes information;
optimize an impedance estimate for each bus in the transmission network for each time period in the time series measurements; and
approximate a long horizon optimal solution based on the optimized impedance estimates for each bus in the transmission network.

13. The system of claim 8, wherein the network admittance matrix estimator processor further configured to:
perform iterations of data exchange between the first layer and the second layer until convergence is reached.

14. The system of claim 8, wherein the network admittance matrix estimator processor further configured to:
perform iterations of data exchange between the first layer and the second layer for a predetermined number of iterations.

* * * * *